US012598835B2

(12) United States Patent
Zhang et al.

(10) Patent No.: US 12,598,835 B2
(45) Date of Patent: Apr. 7, 2026

(54) SOLAR CELL AND PRODUCTION METHOD THEREOF, PHOTOVOLTAIC MODULE

(71) Applicants: ZHEJIANG JINKO SOLAR CO., LTD., Haining (CN); JINKO SOLAR CO., LTD., Jiangxi (CN)

(72) Inventors: Bike Zhang, Haining (CN); Jingsheng Jin, Haining (CN); Xinyu Zhang, Haining (CN); Nannan Yang, Haining (CN)

(73) Assignees: ZHEJIANG JINKO SOLAR CO., LTD., Haining (CN); JINKO SOLAR CO., LTD., Jiangxi (CN)

( * ) Notice: Subject to any disclaimer, the term of this patent is extended or adjusted under 35 U.S.C. 154(b) by 159 days.

(21) Appl. No.: 17/880,641

(22) Filed: Aug. 3, 2022

(65) Prior Publication Data

US 2023/0352602 A1     Nov. 2, 2023

(30) Foreign Application Priority Data

Apr. 27, 2022    (CN) .......................... 202210457639.7

(51) Int. Cl.
*H01L 31/00* (2006.01)
*H10F 19/80* (2025.01)
(Continued)

(52) U.S. Cl.
CPC ........... *H10F 77/311* (2025.01); *H10F 19/80* (2025.01); *H10F 71/129* (2025.01); *H10F 77/211* (2025.01); *H10F 77/703* (2025.01)

(58) Field of Classification Search
CPC ....... H01L 31/02167; H01L 31/022425; H01L 31/02363; H01L 31/048; H01L 31/1868
See application file for complete search history.

(56) References Cited

U.S. PATENT DOCUMENTS 3,994,012 A      11/1976   Warner, Jr.
2010/0294349 A1*  11/2010   Srinivasan ...... H01L 31/022441
                                             257/E21.328
(Continued)

FOREIGN PATENT DOCUMENTS

CN        104362192 A      2/2015
CN        106206838 A     12/2016
(Continued)

OTHER PUBLICATIONS

Zhejiang Jinko Solar Co., Ltd., et al., Extended European Search Report, EP 22184429.3, Dec. 19, 2022, 8 pgs.
(Continued)

*Primary Examiner* — Thanh Truc Trinh
(74) *Attorney, Agent, or Firm* — USCH Law, PC

(57) ABSTRACT

Embodiments of the present disclosure provide a solar cell and a production method thereof, and a photovoltaic module. The solar cell includes: a substrate; a tunnel dielectric layer, located on a surface of the substrate; a doped conductive layer, located on a surface of the tunnel dielectric layer away from the substrate, the doped conductive layer includes a doping element of a same type as a doping element of the substrate, and a plurality of sets of heavily doped areas, the sets includes first heavily doped areas and second heavily doped areas extending in a first direction and arranged at intervals in a second direction; and a plurality of electrodes arranged at intervals, the electrodes extend in the second direction and correspond to the sets, and the electrodes contact with at least part of each sets. The present disclosure can improve photoelectric conversion efficiency of the solar cell.

17 Claims, 8 Drawing Sheets

(51) Int. Cl.

| | |
|---|---|
| *H10F 71/00* | (2025.01) |
| *H10F 77/20* | (2025.01) |
| *H10F 77/30* | (2025.01) |
| *H10F 77/70* | (2025.01) |

(56) References Cited

U.S. PATENT DOCUMENTS

| | | | |
|---|---|---|---|
| 2013/0186457 | A1 | 7/2013 | Kwag et al. |
| 2016/0005903 | A1 | 1/2016 | Wenham et al. |
| 2016/0197204 | A1 | 7/2016 | Lee et al. |
| 2017/0179325 | A1* | 6/2017 | Chung ................ H01L 31/0682 |

FOREIGN PATENT DOCUMENTS

| | | |
|---|---|---|
| CN | 107845692 A | 3/2018 |
| CN | 111524982 A | 8/2020 |
| CN | 112820793 A | 5/2021 |
| CN | 215896415 U | 2/2022 |
| EP | 2672519 A1 | 12/2013 |
| JP | H4-356972 A | 12/1992 |
| JP | 2005005352 A | 1/2005 |
| JP | 2006303230 A | 11/2006 |
| JP | 2013065587 A | 4/2013 |
| JP | 2013236083 A | 11/2013 |
| JP | 2016146471 A | 8/2016 |
| JP | 2017069462 A | 4/2017 |
| JP | 2017130664 A | 7/2017 |
| WO | 2016111132 A1 | 7/2016 |
| WO | 2017037803 A1 | 3/2017 |

OTHER PUBLICATIONS

Zhejiang Jinko Solar Co., Ltd et al., AU Notice of acceptance for your patent application, AU 2022205182, Jul. 18, 2023, 4pgs.

* cited by examiner

SOLAR CELL AND PRODUCTION METHOD THEREOF, PHOTOVOLTAIC MODULE

CROSS REFERENCE TO RELATED APPLICATIONS

The present application claims the benefit of priority under the Paris Convention to Chinese Patent Application No. 202210457639.7 filed on Apr. 27, 2022, which is incorporated herein by reference in its entirety.

TECHNIC FIELD

Embodiments of the present disclosure relates to the field of photovoltaics, and in particular to a solar cell and a production method for the solar cell, and a photovoltaic module.

BACKGROUND

The reasons that affect performance of solar cells (such as photoelectric conversion efficiency) include optical losses and electrical losses. The optical losses include reflection loss on front surface of the cells, shadow loss due to contact with grid lines, and non-absorption loss in long-wavelength bands. The electrical losses include losses due to photo-generated carrier recombination on surface and in interior of semiconductor, contact resistance between semiconductor and metal grid lines, and contact resistance between a metal electrode and semiconductor and the like.

For the purpose of reducing the electrical losses of the solar cells, a tunnel oxide passivated structure for metal contact is formed on the surface of the cells. The tunnel oxide passivated structure for metal contact includes an ultra-thin tunnel dielectric layer and a doped conductive layer. This structure can provide good surface passivation, thereby reducing recombination current at metal contact and improving open-circuit voltage and short-circuit current of the cells. The tunnel oxide passivated structure for metal contact can optimize performance of the solar cells, but there are still many factors that affect the performance of the solar cells of this type. It is of great significance to develop passivated contact solar cells with high efficiency.

SUMMARY

Embodiments of the present disclosure provide a solar cell and a production method thereof, and a photovoltaic module, which is at least beneficial to improve photoelectric conversion efficiency of a passivated contact solar cell.

Some embodiments of the present disclosure provide a solar cell, including: a substrate including an N-type or P-type doping element; a tunnel dielectric layer located on a surface of the substrate; a doped conductive layer located on a surface of the tunnel dielectric layer away from the substrate, the doped conductive layer includes a doping element of a same type as that of the doping element in the substrate, and the doped conductive layer further includes a plurality of sets of heavily doped areas, each respective set of the plurality of sets of heavily doped areas includes at least one first heavily doped area extending in a first direction and at least one second heavily doped area extending in the first direction, and the plurality of sets of heavily doped areas are arranged at intervals in a second direction; and a plurality of electrodes arranged at intervals in the first direction, where each of the plurality of electrodes extends in the second direction and corresponds to the plurality of sets of heavily doped areas, and each of the plurality of electrodes contacts with at least part of each set of heavily doped areas of the doped conductive layer.

Some embodiments of the present disclosure provide a photovoltaic module, including: at least one cell string formed by a plurality of solar cells according to any one of above-mentioned embodiments; an encapsulation adhesive film used for covering a surface of the at least one cell string; and a cover plate used for covering a surface of the encapsulation adhesive film facing away from the at least one cell string.

Some embodiments of the present disclosure provide a production method for a solar cell, including: providing a substrate including a doping element; forming a tunnel dielectric layer located on a surface of the substrate; forming a doped conductive layer located on a surface of the tunnel dielectric layer away from the substrate, where the doped conductive layer includes a doping element of a same type as that in the doping element of the substrate, and the doped conductive layer further includes a plurality of sets of heavily doped areas, where each respective set of the plurality of sets of heavily doped areas includes at least one first heavily doped area extending in a first direction and at least one second heavily doped area extending in the first direction, and the plurality of sets of heavily doped areas are arranged at intervals in a second direction; and forming a plurality of electrodes arranged at intervals in the first direction, where each of the plurality of electrodes extends in the second direction and corresponds to the plurality of sets of heavily doped areas, and where each of the plurality of electrodes contacts with at least part of each set of heavily doped areas of the doped conductive layer.

BRIEF DESCRIPTION OF THE DRAWINGS

One or more embodiments are exemplarily illustrated in reference to corresponding accompanying drawing(s), and these exemplary illustrations do not constitute limitations on the embodiments. Unless otherwise stated, the accompanying drawings do not constitute scale limitations. In order to more clearly illustrate the embodiments of the present disclosure or the technical solutions in the prior art, the accompanying drawings used in the embodiments will be briefly described below. Obviously, the drawings in the following description are only some embodiments of the present disclosure. For those skilled in the art, other drawings can be obtained based on these drawings without any inventive works.

DETAILED DESCRIPTION OF THE EMBODIMENTS

Figure 1:
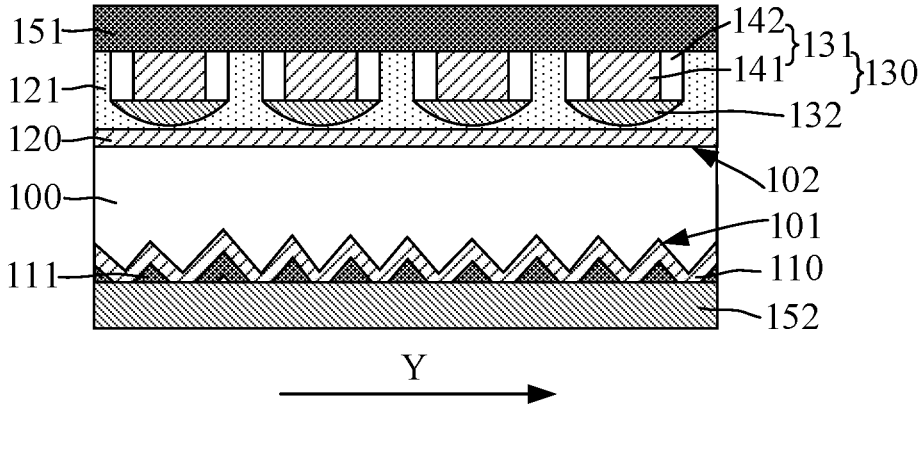
FIG. 1 is a structural schematic diagram of a solar cell according to an embodiment of the present disclosure.

It can be known from the background art that the existing passivated contact solar cells have a problem of low photoelectric conversion efficiency.

By analysis, it is found that one of the reasons for the low photoelectric conversion efficiency of passivated contact solar cells is that in order to improve the photoelectric conversion efficiency of solar cells, local heavy doping treatment is performed on the doped conductive layer, and the formed heavily doped areas correspond to the positions of electrodes, thereby forming an entire heavily doped area. However, during for example laser doping, in order to form a continuous heavily doped area, consecutive laser spots are formed, that is, laser spots without gap therebetween are formed. Due to diffusion, multiple overlapping areas are formed in the heavily doped areas, leading to inhomogeneous doping concentration of the heavily doped areas (where the doping concentration of the overlapping areas is relatively high), thereby affecting the photoelectric conversion efficiency of the solar cells.

Embodiments of the present disclosure provide a solar cell and a production method thereof, and a photovoltaic module. Each of the sets of heavily doped areas in the doped conductive layer is divided into at least one first heavily doped area and at least one second heavily doped area, where a second heavily doped area is located at the peripheries of a corresponding first heavily doped area, and the second heavily doped area is formed by diffusion of the corresponding first heavily doped area. Thus, doping treatment can be performed only on the areas where the first heavily doped areas are located, and there can be no overlapping area between adjacent second heavily doped areas. In this way, the doping concentration can be relatively homogeneous, and the doping homogeneity and the photoelectric conversion efficiency of the solar cells can be improved. Moreover, the doping treated areas are relatively small, for example, in a same solar cell, a number of laser spots in the laser doping is reduced, thereby improving the doping productivity and reducing the damage contact area of the doped conductive layer. Furthermore, the doped conductive layer is provided with sets of heavily doped areas, thus each set of heavily doped areas is in contact with electrodes and a good ohmic contact can be formed. In this way, an effective transport of majority carriers can be ensured, and the photoelectric conversion efficiency of the solar cells can be improved.

Embodiments of the present disclosure will be described in detail below with reference to the accompanying drawings. Those skilled in the art should understand that, in the embodiments of the present disclosure, many technical details are provided for the reader to better understand the present disclosure. However, even without these technical details and various modifications and variants based on the following embodiments, the technical solutions claimed in the present disclosure can be realized.

Figure 2:
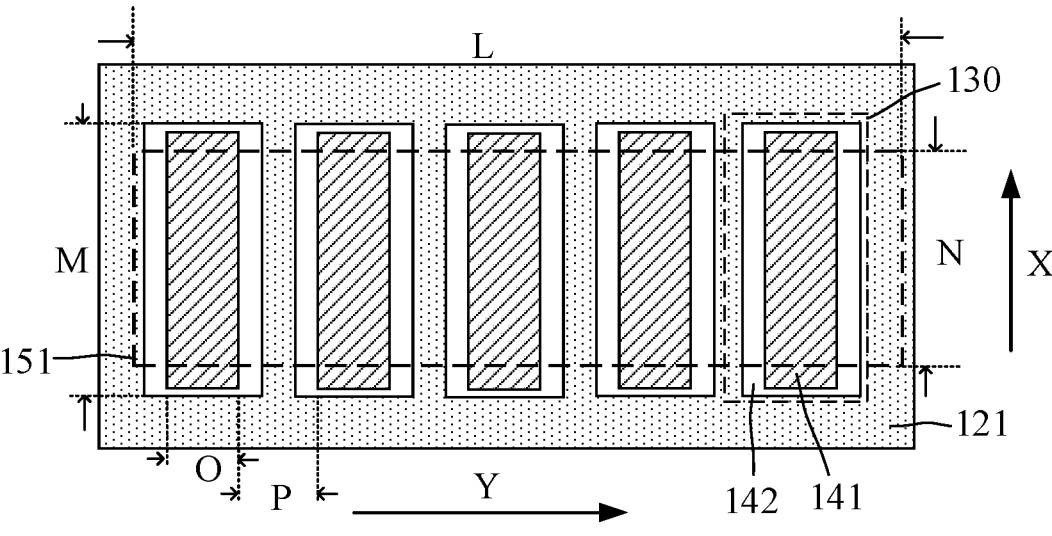
FIG. 2 is a schematic top view of a structure of the solar cell according to an embodiment of the present disclosure.
Figure 3:
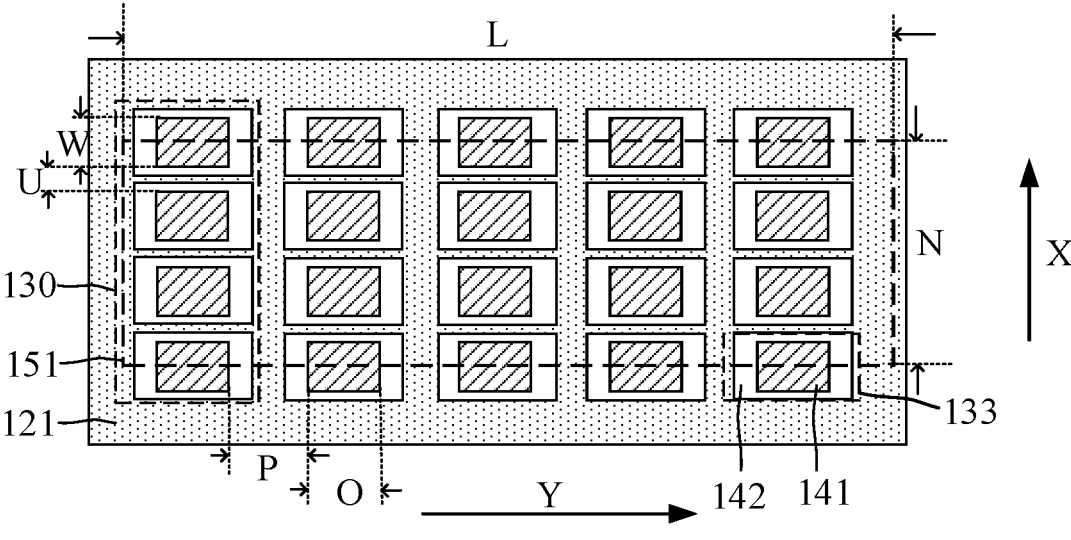
FIG. 3 is another schematic top view of a structure of the solar cell according to an embodiment of the present disclosure.
Figure 4:
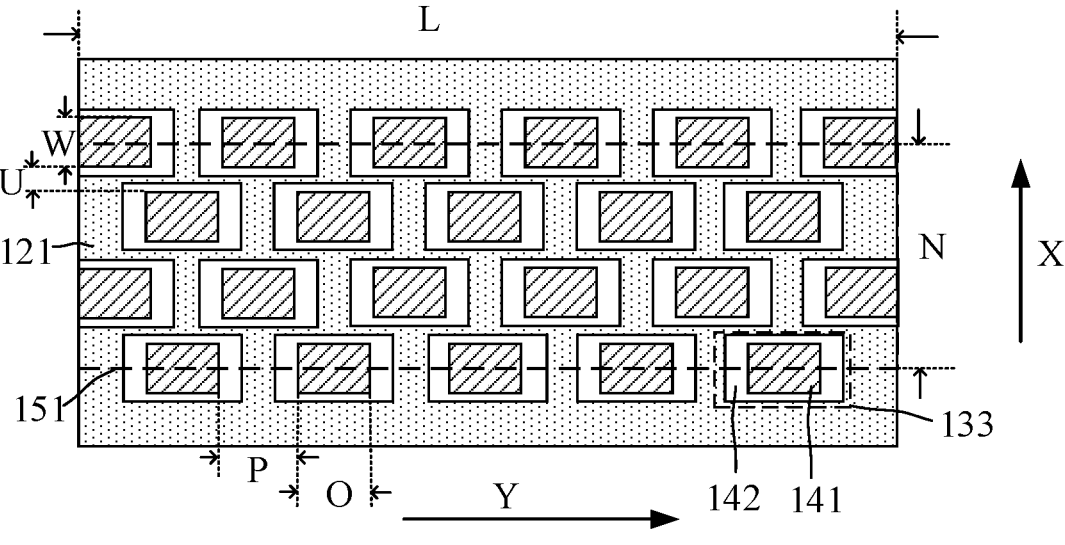
FIG. 4 is yet another schematic top view of a structure of the solar cell according to an embodiment of the present disclosure.

FIG. 1 is a structural schematic diagram of a solar cell according to an embodiment of the present disclosure. FIG. 2 is a schematic top view of a structure of the solar cell according to an embodiment of the present disclosure. FIG. 3 is another schematic top view of a structure of the solar cell according to an embodiment of the present disclosure. FIG. 4 is yet another schematic top view of a structure of the solar cell according to an embodiment of the present disclosure. The electrodes and the passivation layers in FIGS. 2 to 4 are in a see-through state, that is, the surface of the doped conductive layer can be seen through the electrodes and the passivation layers.

Embodiments of the present disclosure provide, on one hand, a solar cell. As shown in FIGS. 1 to 4, the solar cell includes: a substrate 100 including an N-type or P-type doping element; a tunnel dielectric layer 120 located on a surface of the substrate 100; a doped conductive layer 121 located on a surface of the tunnel dielectric layer 120 away from the substrate 100, the doped conductive layer 121 includes a doping element of a same type as that of the doping element in the substrate, and the doped conductive layer 121 further includes a plurality of sets 130 of heavily doped areas, each respective set of the plurality of sets 130 of heavily doped areas includes at least one first heavily doped area 141 extending in a first direction X and at least one second heavily doped area 142 extending in the first direction X, and the plurality of sets 130 of heavily doped areas are arranged at intervals in a second direction Y; and a plurality of electrodes 151 arranged at intervals in the first direction X, where each of the plurality of electrodes 151 extends in the second direction Y and corresponds to the plurality of sets 130 of heavily doped areas, and each of the plurality of electrodes 151 contacts with at least part of each set 130 of heavily doped areas of the doped conductive layer 121.

In some embodiments, the solar cell is a tunnel oxide passivated contact (TOPCon) cell, which may include a double-sided tunnel oxide passivated contact cell or a single-sided tunnel oxide passivated contact cell. As shown in FIG. 1, the solar cell is a single-sided tunnel oxide passivated contact cell.

The substrate 100 is a region that absorbs incident photons to generate photo-generated carriers. In some embodiments, the substrate 100 is a silicon substrate 100, which may include one or more of monocrystalline silicon, polycrystalline silicon, amorphous silicon or microcrystalline silicon. In some other embodiments, the material of the substrate 100 may also be Silicon carbide, organic materials or multicomponent compounds. The multicomponent compound may include, but is not limited to, materials such as perovskite, gallium arsenide, cadmium telluride, copper indium selenide and the like. As an example, the substrate 100 in the present disclosure is a substrate of monocrystalline silicon.

In some embodiments, the substrate 100 has a first surface 101 and a second surface 102 opposite to each other, the first surface 101 of the substrate 100 is referred to as a front surface, and the second surface 102 of the substrate 100 is referred to as a rear surface. Further, for a single-sided cell, the first surface 101 of the substrate 100 is a light-receiving surface, and the second surface 102 of the substrate 100 is a backlight surface; for a double-sided cell, both the first surface 101 and the second surface 102 can function as a light-receiving surface to absorb incident light. As shown in FIG. 1, the first surface 101 of the solar cell is provided with an emitter 110, and the first surface 101 has a textured structure, and the second surface 102 of the solar cell is provided with a tunnel dielectric layer 120 and a doped conductive layer 121, namely the solar cell is a positive junction cell.

In some embodiments, the substrate 100 includes an N-type or P-type doping element, where the element of N type may be a pentavalent element such as phosphorus (P), bismuth (Bi), antimony (Sb) or arsenic (As) or the like, and the element of P type may be a trivalent element such as boron (B), aluminum (Al), gallium (Ga) or indium (In) or the like. For example, when the substrate 100 is a substrate of P type, the doping element in the substrate is of P type. For another example, when the substrate 100 is a substrate of N type, the doping element in the substrate is of N type.

In some embodiments, a conductivity type of the doping element in the substrate 100 is the same as the type of the doping element in the doped conductive layer 121, for example, the doping element in the substrate 100 is of N type, and the doping element in the doped conductive layer 121 is of N type.

In some embodiments, the solar cell includes: an emitter 110 located on a side on which the first surface 101 of the substrate 100 is located. The substrate 100 and the emitter 110 form a PN junction. For example, the substrate 100 includes a N-type doping element, and the emitter 110 includes a P-type doping element. In some other embodiments, the emitter 110 may be regarded as a part of the substrate 100, or, in other words, as an extension of substrate 100. In addition, the emitter 110 can be arranged to have a pyramidal and textured surface, so as to reduce reflection of light on the surface of the emitter 110, thereby increasing the absorption and utilization rate of light, and improving the conversion efficiency of the solar cell.

In some embodiments, the tunnel dielectric layer 120 and the doped conductive layer 121 are located on a side where the second surface 102 of the substrate 100 is located. The tunnel dielectric layer 120 reduces the interface state density between the substrate 100 and the doped conductive layer 121 through chemical passivation, thereby reducing the recombination of minority carriers and holes, and being beneficial to reduce the Jo load current. The tunnel dielectric layer 120 allows majority carriers to tunnel into the doped conductive layer 121, and then the majority carriers are transported laterally in the doped conductive layer 121 and collected by the electrode 151, thereby greatly reducing the contact recombination current between the electrode 151 and the doped conductive layer 121, and improving open circuit voltage and short circuit current of the solar cell.

In some embodiments, material of the tunnel dielectric layer 120 may include, but is not limited to, dielectric materials with tunneling effect such as silicon oxide, silicon nitride, silicon oxynitride, intrinsic amorphous silicon, or intrinsic polysilicon or the like. A thickness of the tunnel dielectric layer 120 may be 0.5 nm to 3 nm, optionally, the thickness of the tunnel dielectric layer 120 is 0.5 nm to 2 nm, and further, the thickness of the tunnel dielectric layer 120 is 0.5 nm to 1.5 nm.

Material of the doped conductive layer 121 can be at least one of polycrystalline semiconductor, amorphous semiconductor, microcrystalline semiconductor and single crystal semiconductor. As an example, the material of the doped conductive layer includes at least one of polycrystalline silicon, amorphous silicon and microcrystalline silicon. The thickness of the doped conductive layer 121 ranges from 20 nm to 150 nm. As an example, the thickness of the doped conductive layer 121 ranges from 60 nm to 90 nm. The above-mentioned ranges of thickness of the doped conductive layer 121 can ensure a low optical loss of the doped conductive layer 121 and a good interface passivation effect of the tunnel dielectric layer, thereby improving the efficiency of the cell. As an example, the material of the doped conductive layer 121 in the present disclosure is polysilicon, and the thickness of the doped conductive layer 121 is 80 nm.

In some embodiments, the plurality of sets 130 of heavily doped areas can be regarded as locally heavily doped areas formed in the doped conductive layer 121, the plurality of sets 130 of heavily doped areas are arranged at intervals in the second direction Y. The plurality of sets 130 of heavily doped areas corresponds to positions of the orthographic projection of the electrodes 151 on the doped conductive layer 121, and each electrode 151 contacts with at least part of each set 130 of heavily doped areas of the doped conductive layer 121 to form an electrical connection. The formed plurality of sets 130 of heavily doped areas are used to increase a number of majority carriers, and reduce the contact recombination current between the electrodes 151 and the doped conductive layer 121, thereby improving the photoelectric conversion efficiency of the solar cell. The sets 130 of heavily doped areas located under a same electrode 151 are arranged at equal intervals, in this way, the current collection of each of the plurality of sets 130 of heavily doped areas can be more uniform.

In some embodiments, as shown in FIG. 2, a width of a set 130 of heavily doped areas in the first direction is M and $N \leq M \leq 2N$, where N represents a width of an electrode 151. The width of a set 130 of heavily doped areas is greater than the width of an electrode 151, to ensure that the areas being in contact with the electrodes 151 all belong to the plurality of sets 130 of heavily doped areas, thereby reducing the contact resistance between the electrodes 151 and the doped conductive layer 121. The width of a set 130 of heavily doped areas is less than twice the width of an electrode 151, to ensure the field passivation effect of the doped conductive layer 121 not being in contact with the electrodes 151, and to prevent the areas occupied by the plurality of sets 130 of heavily doped areas from being too large to cause recombination of majority carriers on surface of the substrate 100. As an example, the width M of a set 130 of heavily doped areas meets $N \leq M \leq 1.2N$.

It should be understood that the electrodes 151 are, in a direction perpendicular to the surface of the substrate 100, in a form of a trapezoid with a narrow top and a wide bottom. In the art, a width of a top end of an electrode 151 is generally defined as the width of the electrode, so an actual width of a contact surface between an electrode 151 and the doped conductive layer 121 is greater than the width of the electrode. In the embodiments of the present disclosure, the width of an electrode 151 is an actual width of the contact surface between the electrode 151 and the doped conductive layer 121. As an example, the width of the contact surface between an electrode 151 and the doped conductive layer 121 ranges from 60 μm to 80 μm, that is, the width N of the electrode 151 is 60 μm to 80 μm, and the width M of a set 130 of heavily doped areas ranges from 60 μm to 110 μm, where the width M may be 60 μm, 80 μm, 90 μm or 103 μm.

In some embodiments, referring to FIG. 1, the first heavily doped areas 141 are areas on which the doping treatment is performed, and the second heavily doped areas 142 are areas formed by diffusion of the first heavily doped areas 141. The doping concentration of the first heavily doped areas 141 is greater than or equal to the doping concentration of the second heavily doped areas 142, and as shown in FIG. 2, the second heavily doped areas 142 surround the first heavily doped areas 141.

It should be understood that there is a blank heavily doped area (i.e., an area without heavy doping) between the adjacent second heavily doped areas 142, as shown in FIG. 1, and the blank heavily doped area is schematically shown as an interval between the adjacent second heavily doped areas 142. In the actual process of producing the solar cell, the process parameters of the doping treatment can be controlled to make a spacing between the adjacent second heavily doped areas 142 to be small or make a width of a formed overlapping area to be small. In this way, the contact area between an electrode 151 and a set 130 of heavily doped areas can be large, and the damage to the surface of the doped conductive layer 121 caused by the doping treatment can be small. When the doping treatment is for example a laser doping treatment, since the number of light spots formed by the laser doping treatment per unit area is reduced, a larger number of solar cells can be subjected to the laser doping treatment per unit time, which is beneficial to improve the productivity of the solar cells.

In some embodiments, referring to FIG. 2, a range of a spacing P between adjacent first heavily doped areas 141 in the second direction Y is $0.2O \geq P \geq 0.05O$, where O represents a length of a first heavily doped area 141. The spacing P between the first heavily doped areas 141 is used to ensure sizes of the formed second heavily doped areas 142, so that the spacing or the overlapping areas between the second heavily doped areas 142 in adjacent sets 130 of heavily doped areas are small, and the lengths of the first heavily doped areas 141 are long. In this way, the contact area between the plurality of electrodes and the plurality of sets 130 of heavily doped areas can be large, which is beneficial to improve the photoelectric conversion efficiency of the solar cells. The length O of a first heavily doped area 141 may range from 1 μm to 20 μm, and as an example, the length O of the first heavily doped area 141 may be 1 μm, 6 μm, 13 μm or 18 μm. The spacing P between adjacent first heavily doped areas 141 ranges from 2 μm to 10 μm. As an example, the spacing P between adjacent first heavily doped areas 141 may be 3 μm, 5 μm, 8 μm or 9.3 μm.

In some embodiments, a range of the spacing P between adjacent first heavily doped areas 141 in the second direction Y is $0.00006L \geq P \geq 0.00001L$, where L represents a length of an electrode.

In some embodiments, as shown in FIG. 3, each respective set of the plurality of sets 130 of heavily doped areas includes a plurality of subsets 133 of doped areas arranged in the first direction X, and each of the plurality of subsets 133 of doped areas includes a first heavily doped area 141 and a second heavily doped area 142. Since the diffusion is isotropic, each of the plurality of sets 130 of heavily doped areas is divided into the plurality of subsets 133 of doped areas, thereby further reducing the area on which the doping treatment is performed, which is beneficial to improve the productivity and reduce the damage area of the surface of the doped conductive layer 121. In this way, a high contact resistance generated when the electrodes are in contact with the damaged layer on the surface of the doped conductive layer 121 can be avoided, which is beneficial to improve the photoelectric conversion efficiency of the solar cells.

In some embodiments, a width W of a subset 133 of doped areas may be the width of a first heavily doped area 141, and the width W of the first heavily doped area 141 of the subset 133 of doped areas in the first direction X meets $0.1N \leq W \leq 1.2N$, to ensure that in the first direction X, a distance between adjacent second heavily doped areas 142 is small or an overlapping area between adjacent second heavily doped areas 142 is small. In this way, the doping uniformity and the doping productivity of the plurality of sets 130 of heavily doped areas can be improved. The width W of a first heavily doped area 141 of a subset 133 of doped areas meets $10 \ \mu m \leq W \leq 110 \ \mu m$, and as an example, the width W may be 10 μm, 39 μm, 63 μm or 101 μm. As an example, the width W of a first heavily doped area 141 of a subset 133 of doped areas ranges from 15 μm to 40 μm, and the width W for example may be 15 μm, 25 μm, 31 μm or 40 μm. A spacing between adjacent subsets 133 of doped areas is U and 2 μm 10 μm, and as an example, the spacing U between adjacent subsets 133 of doped areas may be 2.5 μm, 4.8 μm, 7.3 μm or 9.7 μm.

In some embodiments, as shown in FIG. 4, at least two subsets 133 of doped areas are arranged to be misaligned in the first direction X. In the first direction X, the first heavily doped areas 141 located in different subsets 133 of doped areas are arranged to be misaligned, and the spacing between adjacent first heavily doped areas 141 can be surrounded by the second heavily doped areas 142 formed by diffusion in four directions, thereby reducing area of the blank areas (i.e., areas without heavy doping). In this way, the proportion of heavily doped areas in the surface where the electrodes and the doped conductive layer are in contact can be increased as much as possible. Thus, the contact resistance can be reduced, which is beneficial to improve the photoelectric conversion efficiency of the solar cells.

Referring to FIG. 1, in some embodiments, in a direction perpendicular to the substrate 100, a doping depth of the plurality of sets 130 of heavily doped areas is less than or equal to a thickness of the doped conductive layer, which is beneficial to avoid damaging the surface of the tunnel dielectric layer 120 when forming the plurality of sets 130 of heavily doped areas, and to avoid affecting the film uniformity of the tunnel dielectric layer 120, thereby affecting the effect of field passivation.

In some embodiments, each respective set of the plurality of sets 130 of heavily doped areas includes a first region 131 and a second region 132 arranged in the direction perpendicular to the substrate 100, a doping concentration of the second region 132 is smaller than a doping concentration of the first region 131, and each of the plurality of electrodes 151 is in contact with the first regions 131 of the doped conductive layer 121. The first region 131 may include the first heavily doped area 141 and the second heavily doped area 142. In some other embodiments, the first region may include the first heavily doped area.

In some embodiments, due to the principle of diffusion, the cross-sectional shape of the second region 132 in the first direction X is a circular arc shape, a semicircular shape, an approximate circular arcs shape or an approximate semicircular shape. Similarly, the cross-sectional shape of the second region 132 in the second direction Y is a circular arc shape, a semicircular shape, an approximate circular arc shape or an approximate semicircular shape. The doping concentration of the second region 132 is greater than or equal to the doping concentration of the doped conductive layer 121. The doping concentration of the second region 132 decreases in a gradient in a direction from the first region 131 to the second region 132, that is, the doping concentration of the second region 132 may be distributed in steps or a gradient in the direction from the first region 131 towards the second region 132, and the closer to the tunnel dielectric layer 120, the smaller the doping concentration.

In some embodiments, referring to FIG. 1, the solar cell further includes a passivation layer (not shown), the passivation layer is located on the surface of the doped conductive layer 121, and the plurality of electrodes 151 penetrate the passivation layer and contact with the surface the doped conductive layer 121. The passivation layer can reduce the recombination on the metal areas resulted from the contact of the electrodes 151 with the doped conductive layer 121, thereby improving efficiency of the cell. The passivation layer can be a single-layer structure or a laminated structure, and material of the passivation layer can be one or more of the materials such as silicon oxide, silicon nitride, silicon oxynitride, silicon oxycarbonitride, titanium oxide, hafnium oxide and aluminum oxide and the like. For those skilled in the art, the passivation layer also has the function of an anti-reflection layer to increase light utilization.

Each of the plurality of electrodes 151 functions as a grid line of the solar cell for collecting and converging the currents of the solar cell. The electrodes 151 may be sintered from a firing-through paste. The contact between the electrodes 151 and the doped conductive layer 121 may be a local contact or a complete contact. The material of the electrodes 151 may be one or more of aluminum, silver, gold, nickel, molybdenum and copper. In some embodiments, as shown in FIG. 1, when the doped conductive layer 121 is located on the back surface of the substrate 100, the electrodes 151 are lower electrodes or back electrodes. In some cases, the electrodes 151 refer to thin grid lines or finger-shaped grid lines to distinguish them from main grid lines or bus bars.

In some embodiments, the solar cell further includes: a first passivation layer 111, the first passivation layer 111 is located on the surface of the emitter 110 away from the substrate 100, and the first passivation layer 111 is regarded as a front passivation layer; and a plurality of first electrodes 152 arranged at intervals in the first direction X, each of the plurality of first electrodes 152 extends in the second direction Y, and each of the plurality of first electrodes 152 penetrates through the first passivation layer 111 and is in contact with the emitter 110.

In some embodiments, the first passivation layer 111 is a single-layer structure or a laminated structure, and the material of the first passivation layer 111 can be one or more of the materials such as silicon oxide, silicon nitride, silicon oxynitride, silicon oxycarbonitride, titanium oxide, hafnium oxide and aluminum oxide and the like. The plurality of first electrodes 152 may be sintered from a firing-through paste. The contact between the plurality of first electrodes 152 and the emitter 110 may be a local contact or a complete contact. The material of the plurality of first electrodes 152 may be one or more of aluminum, silver, gold, nickel, molybdenum and copper. The plurality of first electrodes 152 are upper electrodes or front electrodes. In some cases, the plurality of first electrodes 152 refer to thin grid lines or finger-shaped grid lines to distinguish them from main grid lines or bus bars.

In the solar cell as shown in FIGS. 1 and 4, the doped conductive layer 121 includes the plurality of sets 130 of locally and heavily doped areas extending in the first direction X, the doped conductive layer 121 can form obvious energy band bending on the surface of the substrate 100, thereby realizing a field passivation for minority carriers and a selective transport for majority carriers, and a good ohmic contact can be formed between the doped conductive layer and the electrodes 151 to ensure an effective transport of majority carriers. Moreover, each of the plurality of electrodes 151 corresponds to the plurality of sets 130 of heavily doped areas, that is, a local doping treatment is performed on the regions where the plurality of sets 130 of heavily doped areas are formed to reduce the damage contact area of the doped conductive layer 121, so that a good field passivation is formed by the tunnel dielectric layer 120 and the doped conductive layer 121. In this way, a carrier recombination rate on the surface can be reduced, and the photoelectric conversion efficiency of the cell can be improved. Furthermore, the entire area for the plurality of sets 130 of heavily doped areas is divided into a plurality of first heavily doped areas 141, that is, the areas on which the heavy doping treatment is performed are reduced, in this way, doping productivity can be improved. The entire heavily doped area is divided into a plurality of first heavily doped areas 141 to avoid overlapping areas within the plurality of sets 130 of heavily doped areas, in this way, a doping homogeneity and therefore the photoelectric conversion efficiency of the solar cell can be improved.

Figure 5:
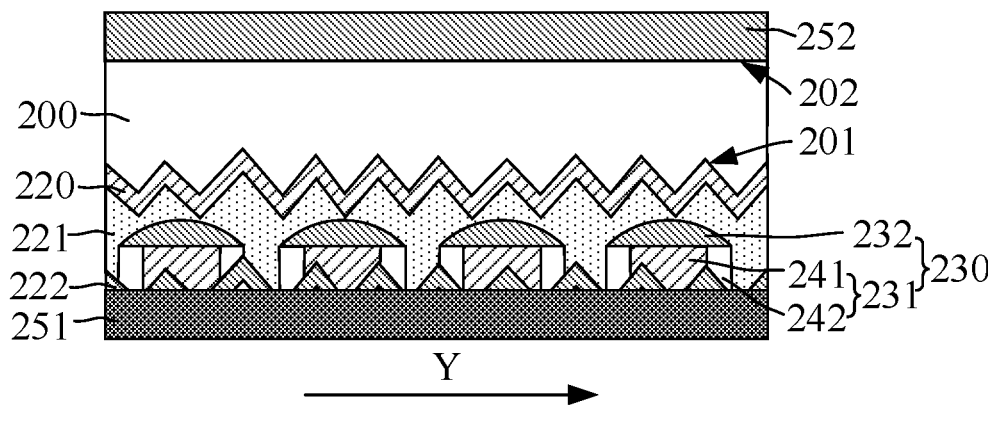
FIG. 5 is a structural schematic diagram of a solar cell according to another embodiment of the present disclosure.

FIG. 5 is a structural schematic diagram of a solar cell according to another embodiment of the present disclosure. A part of the solar cell as shown in FIG. 5 has the same structure as the solar cell as shown in FIGS. 1 to 4, the main difference is that the tunnel dielectric layer and the doped conductive layer are located on the first surface (also called the front surface) of the substrate. The identical or similar contents or details of elements to those provided in the descriptions of the embodiments shown in FIGS. 1 to FIG. 4 will not be repeated, and only descriptions that are different from the above descriptions will be detailed. The solar cell provided by another embodiment of the present disclosure will be described in detail below with reference to FIG. 5.

Referring to FIG. 5, the solar cell includes: a substrate 200 including a first surface 201 (also referred to as a front surface 201) and a second surface 202 (also referred to as a rear surface 202) opposite to the first surface; a tunnel dielectric layer 220 and a doped conductive layer 221 located on a side on which the first surface 201 of the substrate 200 is located, and the tunnel dielectric layer 220 is located between the doped conductive layer 221 and the substrate 200; a passivation layer 222, the passivation layer 222 is located on a surface of the doped conductive layer 221 away from the substrate 200, and the passivation layer 222 is regarded as a front passivation layer; a plurality of electrodes 251 (also referred to as first electrodes 251) arranged at intervals in the first direction X, each of the plurality of electrodes 251 extends in the second direction Y, penetrates the passivation layer 222 and is in contact with at least part of the surface structures of each set 230 of heavily doped areas of the doped conductive layer 221; and a second passivation layer and an electrode 252 (also referred to as the second electrode 252) located on a side on which the second surface 202 of the substrate 200 is located, the electrode 252 penetrates through the second passivation layer and are in contact with the substrate 200, and the second passivation layer is regarded as a rear passivation layer.

It should be understood that the solar cell as shown in FIG. 5 may be a back junction solar cell, that is, the PN junction of the cell forms the back side of the cell. The doping element in the doped conductive layer 221 is of a same type as that of the doping element in the substrate 200, for example, the substrate 200 is a N-type substrate, and the doped conductive layer 221 is doped with an N-type element; for another example, the substrate 200 is a P-type substrate, and the doped conductive layer 221 is doped with a P-type element. An emitter area is formed close to the second surface 202 and inside the substrate 200, the emitter area includes a doping element of a type opposite to that of the doping element of the substrate 200.

It should be understood that the doped conductive layer 221 and the above-mentioned doped conductive layer 121 (refer to FIG. 1 to FIG. 4) are the same or similar elements, that is, in some other embodiments of the present disclosure, the doped conductive layer 221 may include a plurality of sets 230 of heavily doped areas extending in the first direction, each respective set of the plurality of sets 230 of heavily doped areas includes a first heavily doped area 241 and a second heavily doped area 242. Similarly, each respective set of the plurality of sets 230 of heavily doped areas may include a plurality of subsets of doped areas, and the plurality of subsets of doped areas are arranged in the first direction.

In some embodiments, the second passivation layer is a single-layer structure or a laminated structure, and the material of the second passivation layer can be one or more of the materials such as silicon oxide, silicon nitride, silicon oxynitride, silicon oxycarbonitride, titanium oxide, hafnium oxide and aluminum oxide and the like. The electrode 252 may be sintered from a firing-through paste. The contact between the electrode 252 and the substrate 200 may be a local contact or a complete contact. The material of the electrode 252 may be one or more of aluminum, silver, gold, nickel, molybdenum and copper. The electrodes 251 are upper electrodes or front electrodes, and the electrode 252 are lower electrodes or back electrodes.

The foregoing (the solar cell as shown in FIG. 1 or FIG. 5) is an example of providing a tunnel dielectric layer and a doped conductive layer with heavily doped areas on a single surface (the first surface or the second surface) of the substrate. Some other embodiments of the present disclosure further propose that both surfaces (the first surface and the second surface) of the substrate are respectively provided with a tunnel dielectric layer and a doped conductive layer, that is, the solar cell is a double-sided tunnel oxide passivated contact cell. The identical or similar contents or details of elements to those provided in the descriptions of the embodiments shown in FIGS. 1 to FIG. 5 will not be repeated, and only descriptions that are different from the above descriptions will be detailed. The following detailed description refer to FIG. 6 and FIG. 7.

Figure 6:
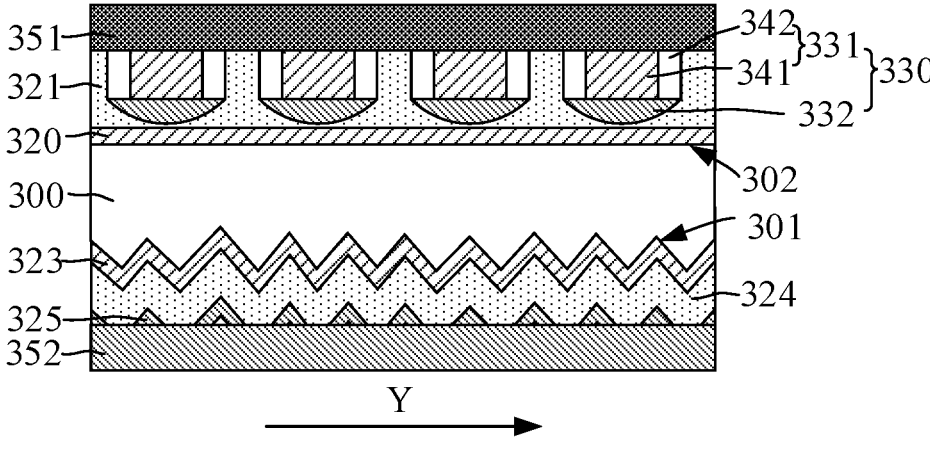
FIG. 6 is a structural schematic diagram of a solar cell according to yet another embodiment of the present disclosure.

FIG. 6 is a structural schematic diagram of a solar cell according to yet another embodiment of the present disclosure. Referring to FIG. 6, the solar cell includes: a substrate 300 including a first surface 301 and a second surface 302 opposite to the first surface; a first tunnel dielectric layer 323, a first doped conductive layer 324, a third passivation layer 325 and an electrode 352 that are stacked in sequence and located on a side on which the first surface 301 of the substrate 300 is located, the electrode 352 penetrates the third passivation layer 325 and is in contact with the first doped conductive layer 324, the third passivation layer 325 is regarded as a front passivation layer, and the electrode 352 is an upper electrode or a front electrode; a tunnel dielectric layer 320 (also referred to as a second tunnel layer 320) and a doped conductive layer 321 (also referred to as a second conductive layer 321) located on a side on which the second surface 302 of the substrate 300 is located, and the tunnel dielectric layer 320 is located between the doped conductive layer 321 and the substrate 300; a passivation layer located on a surface of the doped conductive layer 321 away from the substrate 300, and the passivation layer is regarded as a rear passivation layer; and a plurality of electrodes 351 arranged at intervals in the first direction X, each of the plurality of electrodes 351 extends in the second direction Y, penetrates the passivation layer and is in contact with the doped conductive layer 321, the plurality of electrodes 351 are lower electrodes or back electrodes.

In some embodiments, the doping element of the first doped conductive layer 324 is of a type opposite to a type of the doping element in the substrate 300, and the doping element of the doped conductive layer 321 is of a same type as that of the doping element in the substrate 300. In one example, the substrate 300 includes a N-type doping element, the doped conductive layer 321 includes a N-type doping element, and the first doped conductive layer 324 includes a P-type doping element. In another example, the substrate 300 includes a P-type doping element, the doped conductive layer 321 includes a P-type doping element, and the first doped conductive layer 324 includes a N-type doping element. The solar cell as shown in FIG. 6 may be a positive junction solar cell.

The doped conductive layer 321 and the doped conductive layer 121 (refer to FIG. 1 to FIG. 4) are the same or similar elements, that is, in some other embodiments of the present disclosure, the doped conductive layer 321 may include a plurality of sets 330 of heavily doped areas extending in the first direction, each respective set of the plurality of sets 330 of heavily doped areas includes a first heavily doped area 341 and a second heavily doped area 342. Similarly, each respective set of the plurality of sets 330 of heavily doped areas may include a plurality of subsets of doped areas, and the plurality of subsets of doped areas are arranged in the first direction.

In some embodiments, material of the first tunnel dielectric layer 323 may be any one of silicon oxide, silicon nitride, silicon oxynitride, intrinsic amorphous silicon and intrinsic polysilicon. The thickness of the first tunnel dielectric layer 323 may range from 0.5 nm to 3 nm. As an example, the thickness of the first tunnel dielectric layer 323 ranges from 0.5 nm to 2 nm, and further, the thickness of the first tunnel dielectric layer 323 ranges from 0.5 nm to 1.5 nm. The material of the first doped conductive layer 324 includes at least one of polysilicon, amorphous silicon and microcrystalline silicon. The thickness of the first doped conductive layer 324 ranges from 20 nm to 150 nm. As an example, the thickness of the first doped conductive layer 324 ranges from 60 nm to 90 nm.

In some embodiments, the third passivation layer 325 is a single-layer structure or a laminated structure, and the material of the third passivation layer 325 can be one or more of the materials such as silicon nitride, silicon oxynitride, silicon oxycarbonitride, titanium oxide, hafnium oxide and aluminum oxide and the like.

The electrode 352 may be sintered from a firing-through paste. The contact between the electrode 352 and the first doped conductive layer 324 may be a local contact or a complete contact. The material of the electrode 352 may be one or more of aluminum, silver, gold, nickel, molybdenum and copper.

Figure 7:
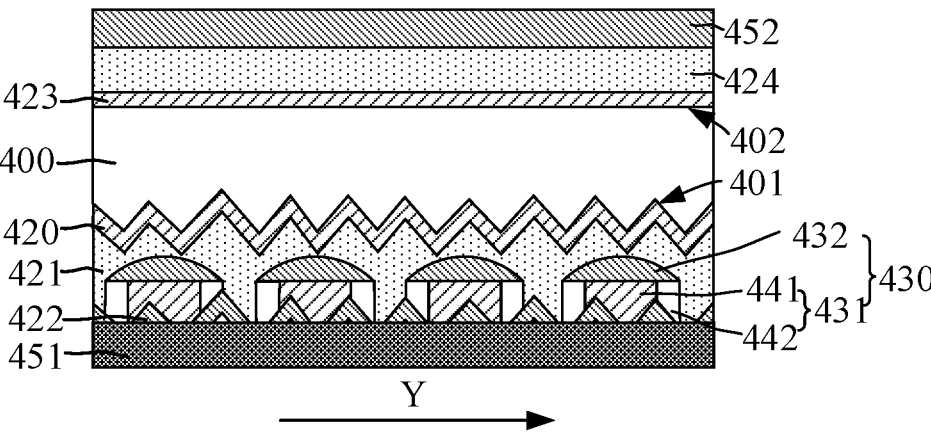
FIG. 7 is a structural schematic diagram of a solar cell according to still another embodiment of the present disclosure.

FIG. 7 is a structural schematic diagram of a solar cell according to still another embodiment of the present disclosure. A part of the solar cell as shown in FIG. 7 has the same structure as the solar cell provided by the aforementioned embodiment (FIG. 6). The identical or similar contents or details of elements to those provided in the descriptions of the above-mentioned embodiments will not be repeated, and only descriptions that are different from the above descriptions will be detailed.

Referring to FIG. 7, the solar cell includes: a substrate 400 including a first surface 401 and a second surface 402 opposite to the first surface; a tunnel dielectric layer 420 and a doped conductive layer 421 located on a side on which the first surface 401 of the substrate 400 is located, and the tunnel dielectric layer 420 is located between the doped conductive layer 421 and the substrate 400; a passivation layer 422, the passivation layer 422 is located on a surface of the doped conductive layer 421 away from the substrate 400, and the passivation layer 422 is regarded as a front passivation layer; a plurality of electrodes 451 arranged at intervals in the first direction X, each of the plurality of electrodes 451 extends in the second direction Y, penetrates the passivation layer and is in contact with the doped conductive layer 421, the plurality of electrodes 451 are upper electrodes or front electrodes; a first tunnel dielectric layer 423 (also referred to as a first tunnel layer 423), a first doped conductive layer 424 (also referred to as a first conductive layer 424), a third passivation layer and an electrode 452 that are stacked in sequence and located on a side on which the second surface 402 of the substrate 400 is located, the electrode 452 penetrates the third passivation layer and is in contact with the first doped conductive layer 424, the third passivation layer is regarded as a rear passivation layer, and the electrode 452 is a lower electrode or a back electrode.

The doped conductive layer 421 and the doped conductive layer 121 as shown in FIG. 1 to FIG. 4 are the same or similar elements, the doped conductive layer 421 may include a plurality of sets 430 of heavily doped areas, each respective set of the plurality of sets 430 of heavily doped areas includes a first heavily doped area 441 extending in the first direction and a second heavily doped area 442 extending in the first direction. Similarly, each respective set of the plurality of sets 430 of heavily doped areas may include a plurality of subsets of doped areas, and the plurality of subsets of doped areas are arranged in the first direction.

In some embodiments, the doping element of the doped conductive layer 421 is of a same type as that of the doping element in the substrate 400, and the doping element of the first doped conductive layer 424 is of a type opposite to a type of the doping element in the substrate 400. In one example, the substrate 400 includes a N-type doping element, the doped conductive layer 421 includes a N-type doping element, and the first doped conductive layer 424 includes a P-type doping element. In another example, the substrate 400 includes a P-type doping element, the doped conductive layer 421 includes a P-type doping element, and the first doped conductive layer 424 includes a N-type doping element. The solar cell as shown in FIG. 7 may be a back junction solar cell.

Figure 8:
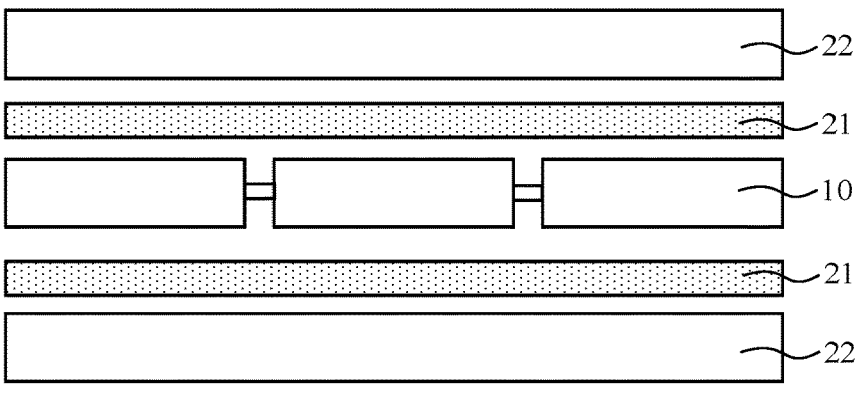
FIG. 8 is a structural schematic diagram of a photovoltaic module according to an embodiment of the present disclosure.

In another aspect of the present disclosure, embodiments of the present disclosure further provide a photovoltaic module, which is used for converting received light energy into electrical energy. FIG. 8 is a structural schematic diagram of the photovoltaic module according to an embodiment of the present disclosure. Referring to FIG. 8, the photovoltaic module includes: at least one cell string 10 formed by a plurality of solar cells provided by any one of the above embodiments (FIGS. 1 to 7); an encapsulation adhesive film 21 used for covering a surface of the at least one cell string 10; and a cover plate 22 used for covering a surface of the encapsulation adhesive film 21 facing away from the at least one cell string 10.

The encapsulation adhesive film 21 may be an organic encapsulation adhesive film such as EVA or POE and the like. The encapsulation adhesive film 21 covers the surfaces of the cell string 10 to seal and protect the cell string. In some embodiments, the encapsulation adhesive film 21 may include an upper encapsulation adhesive film and a lower encapsulation adhesive film for encapsulating the upper and lower surfaces of the cell strings 10, respectively. The cover plate 22 can be a cover plate for protecting the cell string 10 such as a glass cover plate or a plastic cover plate. The cover plate 22 covers a surface of the encapsulation adhesive film 21 away from the cell string 10, and the cover plate 22 includes an upper cover plate located on a surface of the upper encapsulation adhesive film and a lower cover plate located on a surface of the lower encapsulation adhesive film. In some embodiments, a light trapping structure is provided on the cover plate 22 to increase the utilization rate of incident light. The photovoltaic module has a high current collection capability and a low carrier recombination rate, which can achieve high photoelectric conversion efficiency.

In another aspect of the present disclosure, embodiments of the present disclosure further provide a production method for a solar cell, the method is used to produce the solar cell provided by the above embodiments (shown in FIGS. 1 to 4). The identical or similar contents or details of elements to those provided in the descriptions of the above embodiments will not be repeated, and only descriptions that are different from the above descriptions will be detailed.

FIGS. 9 to 21 are structural schematic diagrams corresponding to the operations of the production method for a solar cell according to an embodiment of the present disclosure. FIG. 13, FIG. 14, FIG. 15 and FIG. 18 are schematic top view of structures of the solar cell.

Figure 9:
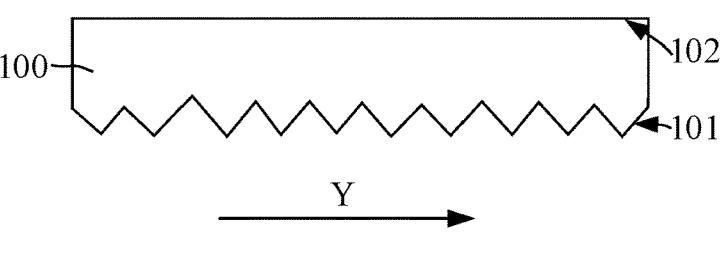
FIGS. 9 to 21 are structural schematic diagrams corresponding to the operations of a production method for a solar cell according to an embodiment of the present disclosure.

Referring to FIG. 9, a substrate 100 including a doping element is provided.

The substrate 100 has a first surface 101 and a second surface 102 opposite to each other. In some embodiments, the first surface 101 of the substrate 100 is a light-receiving surface, and the second surface 102 of the substrate 100 is a backlight surface. The first surface 101 of the substrate 100 has a textured structure, and the second surface 102 of the substrate 100 has a polished structure.

Figure 10:
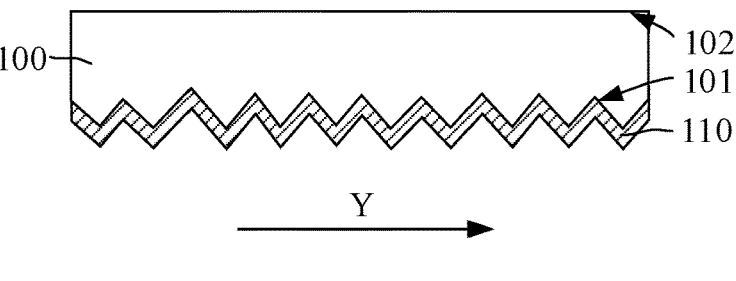

Referring to FIG. 10, an emitter 110 is formed, the emitter 110 is the first surface 101 of the substrate 100.

Figure 11:
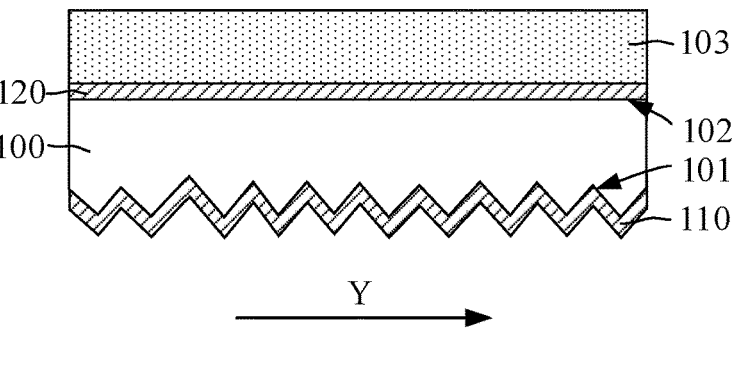

Referring to FIG. 11, a tunnel dielectric layer 120 is formed, the tunnel dielectric layer 120 is located on a surface of the substrate 100. As an example, the tunnel dielectric layer 120 is located on the second surface 102 of the substrate 100.

Referring to FIGS. 11 to 19, a doped conductive layer 121 is formed, the doped conductive layer 121 is located on a surface of the tunnel dielectric layer 120 away from the substrate 100, the doped conductive layer 121 includes a doping element of a same type as that of the doping element in the substrate 100, and the doped conductive layer 121 further includes a plurality of sets 130 of heavily doped areas, each respective set of the plurality of sets 130 of heavily doped areas includes at least one first heavily doped area 141 extending in a first direction and at least one second heavily doped area 142 extending in the first direction, and the plurality of sets 130 of heavily doped areas are arranged at intervals in a second direction Y.

In an example, referring to FIG. 11, a doped conductive film 103 is formed, the doped conductive film 103 is located on the surface of the tunnel dielectric layer 120 away from the substrate 100.

In some embodiments, an intrinsic doped conductive layer may be formed by low pressure chemical vapor deposition (LPCVD) and then a diffusion or an ion implantation doping is performed to form the doped conductive film 103, and the intrinsic doped conductive layer may be an intrinsic polysilicon layer. In some other embodiments, an initial conductive film is doped and deposited by plasma enhanced chemical vapor deposition (PECVD), and then is annealed to form the doped conductive film 103. The material of the initial conductive film may be amorphous silicon or microcrystalline silicon. The material of the doped conductive film 103 may be polycrystalline silicon, amorphous silicon, microcrystalline silicon or single crystal silicon. Exemplarily, the material of the doped conductive film 103 in the embodiments of the present disclosure is polysilicon.

A first doping treatment is performed on the doped conductive film 103, the first doping treatment is used to perform doping treatment on the entire surface of the doped conductive film 103 to form areas of the doped conductive layer excluding the sets of heavily doped areas.

Referring to FIGS. 12 to 16, a dopant source layer 104 is formed on the surface of the doped conductive film 103, and a second doping treatment is performed on the doped conductive film 103 to form the doped conductive layer 121.

In some embodiments, the second doping treatment is used to form the sets 130 of heavily doped areas, and after forming the doped conductive layer 121, the remaining dopant source layer 104 is removed.

Figure 12:
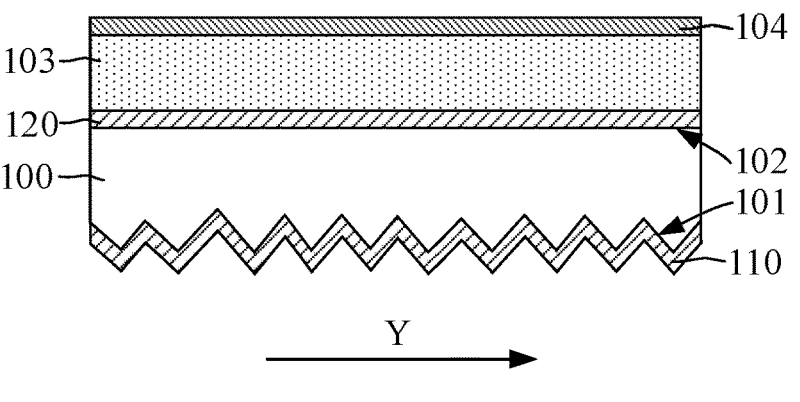

In some embodiments, as shown in FIG. 12, the dopant source layer 104 is located on the entire surface of the doped conductive film 103. The material of the dopant source layer 104 may include, but is not limited to, phosphosilicate glass (PSG) or borophosphosilicate glass (BPSG). In some other embodiments, the material of the dopant source layer may be borosilicate glass (BSG).

Figure 13:
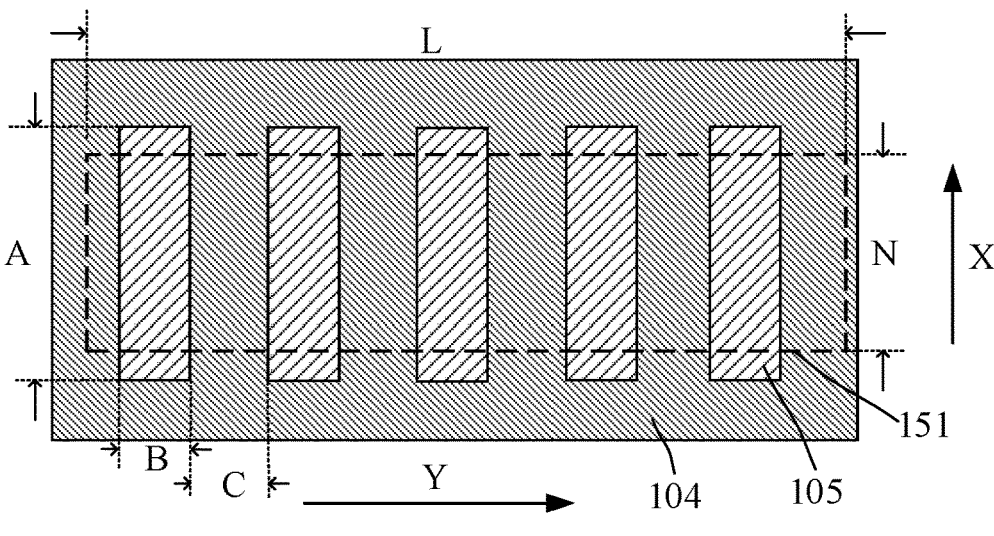

Referring to FIG. 13, the second doping treatment is laser doping. A light spot pattern 105 is formed by laser doping on a surface of the dopant source layer 104. A width A of the light spot pattern 105 is smaller than a width of a set of heavily doped areas which is subsequently formed, a length B of the light spot pattern 105 is equal to a length of a first heavily doped area which is subsequently formed, and an interval C between adjacent light spot patterns 105 is equal to a length of the first heavily doped area. It should be understood that the areas where the light spot patterns 105 are located are the areas for the first heavily doped areas formed subsequently, so the specification parameters (width, length and interval, etc.) of the light spot pattern 105 are used to ensure that the effect achieved by the first heavily doped areas formed subsequently, that is, the effect of the specification parameter ranges of the light spot pattern 105 is the same as the effect of the specification parameter ranges of the first heavily doped areas, which will not be repeated here.

Figure 14:
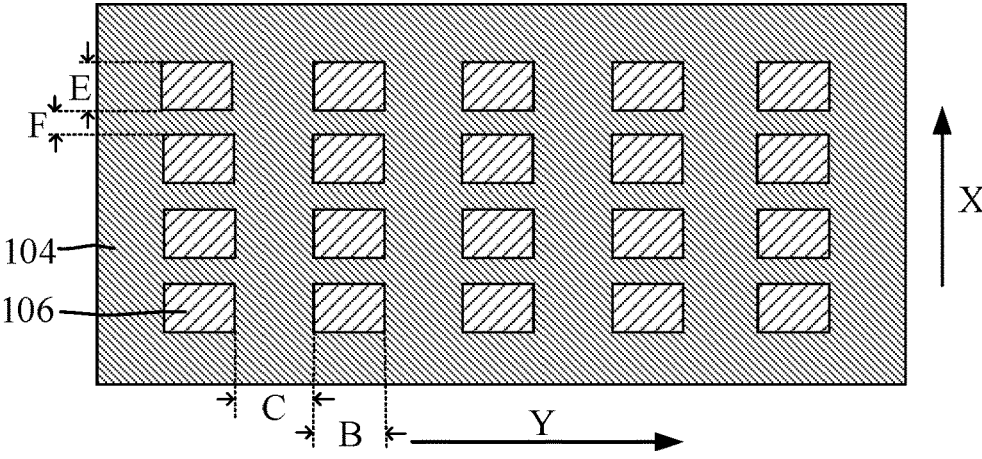
Figure 15:
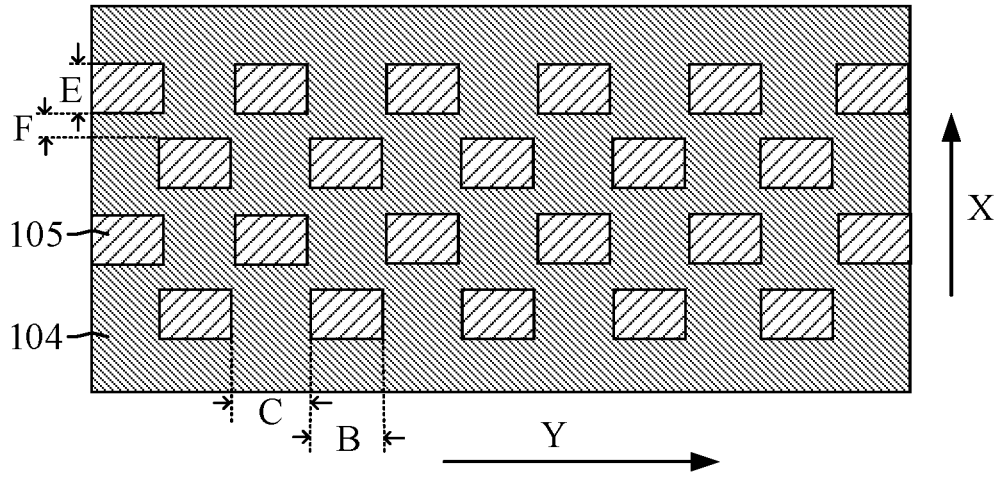

Similarly, referring to FIG. 14 and FIG. 3, the arrangement of the light spot patterns 105 in FIG. 14 can form the sets of heavily doped areas as shown in FIG. 3. A width E of a light spot pattern 105 in the first direction X is equal to the width W of a first heavily doped area 141, and a spacing F between adjacent light spot patterns 105 in the first direction is equal to the spacing U between adjacent first heavily doped areas 141; a length B of a light spot pattern 105 in the second direction Y is equal to a length O of a first heavily doped area, and a spacing C between adjacent light spot patterns 105 in the second direction is equal to the spacing P between adjacent first heavily doped areas 141. The arrangement of the light spot patterns 105 as shown in FIG. 15 is used to form the sets of heavily doped areas as shown in FIG. 4, and at least two columns of the light spot patterns 105 are arranged to be misaligned in the first direction X.

Figure 16:
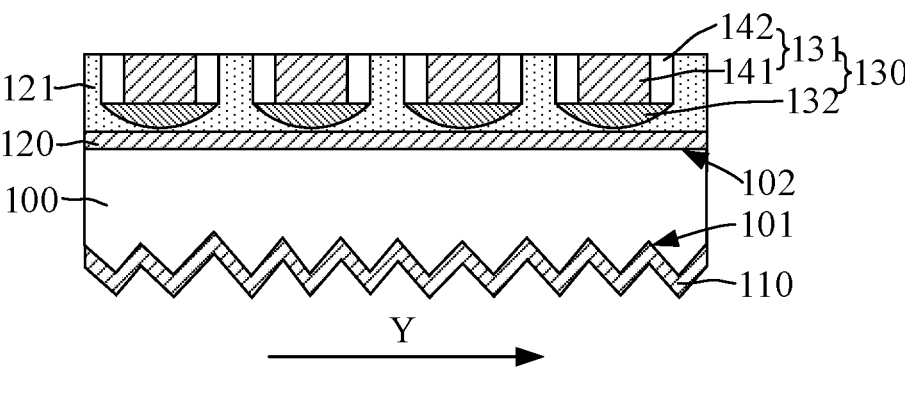

Referring to FIG. 16, a diffusion treatment is performed to diffuse the doping ions in part of the areas of the dopant source layer 104 (referring to FIG. 12) into the doped conductive film 103 (referring to FIG. 12) to form the sets 130 of heavily doped areas. Then the dopant source layer 104 is removed.

In some embodiments, wet etching is used to completely remove the dopant source layer 104, so as to avoid the existence of residual phosphosilicate glass, which may cause surfaces of the silicon wafer to be wet in the air, resulting in the reduction of current and the attenuation of power. Complete removal of the dopant source layer also can prevent the passivation layer formed on the doped conductive layer 121 from peeling off, which is beneficial to improve the photoelectric conversion efficiency of the solar cell. The solution for the wet etching is a mixed liquid of $HNO_3$ and HF. In some other embodiments, a thermal diffusion process or an ion implantation process may be used for the diffusion treatment.

It should be noted that the foregoing (FIGS. 12-16) takes the example that the dopant source layer 104 is located on the entire surface of the doped conductive film 103, and a plurality of dopant source sub-layers distributed at intervals can also be formed in the embodiments of the present disclosure. The following will be described in detail with reference to FIG. 17 to FIG. 19.

Figure 17:
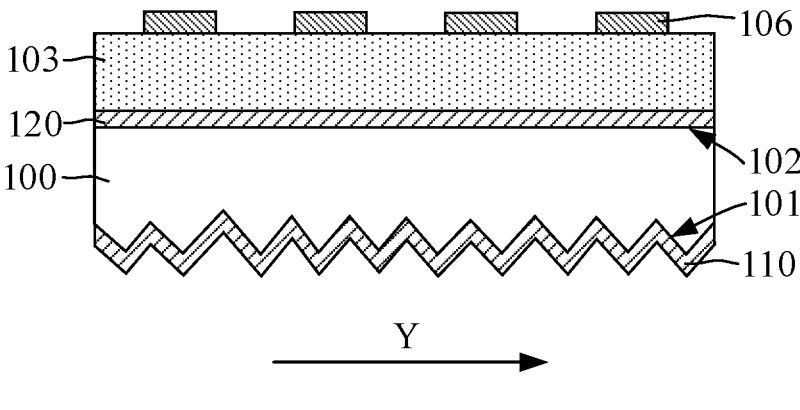

Referring to FIG. 17, a dopant source is formed on the surface of the doped conductive film 103. The dopant source includes a plurality of dopant source sub-layers 106, and the positions of the plurality of dopant source sub-layers 106 correspond to the positions of the first heavily doped areas of the sets of heavily doped areas.

Figure 18:
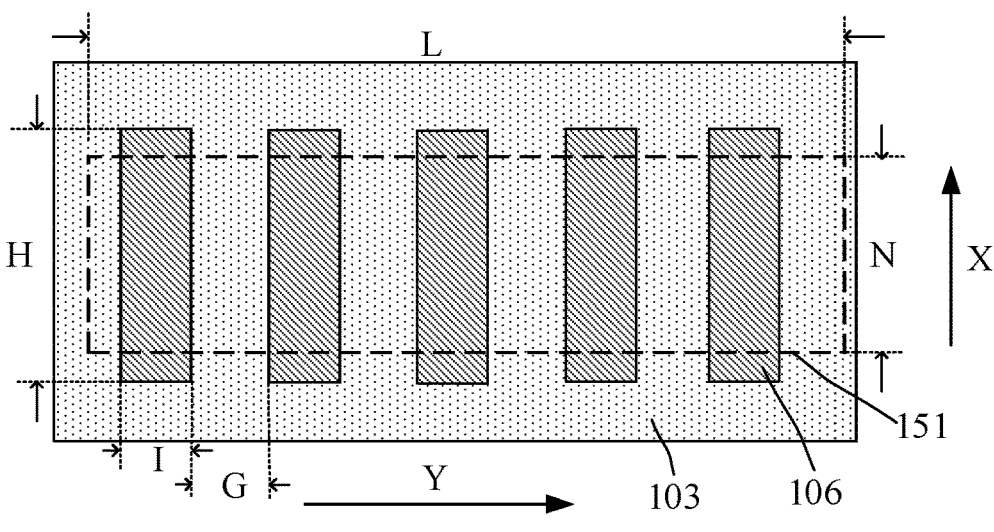

It should be understood that, referring to FIG. 18, a width H of a dopant source sub-layer 106 is smaller than a width of a subsequently formed set of heavily doped area, a length I of the dopant source sub-layer 106 is equal to a length of a subsequently formed first heavily doped area, and a spacing G between adjacent dopant source sub-layers 106 is equal to the length of the first heavily doped area. The areas where the dopant source sub-layers 106 are located are the areas for the first heavily doped areas formed subsequently, so the specification parameters (width, length and spacing, etc.) of the dopant source sub-layers 106 are used to ensure that the effect achieved by the first heavily doped areas formed subsequently, that is, the effect of the specification parameter ranges of the dopant source sub-layers 106 is the same as the effect of the specification parameter ranges of the first heavily doped areas, which will not be repeated here.

Similarly, in some other embodiments, the arrangement of the dopant source sub-layers can form the sets of heavily doped areas as shown in FIG. 3. A width of a dopant source sub-layer in the first direction is equal to the width W of a first heavily doped area 141, and a spacing between adjacent dopant source sub-layers in the first direction is equal to the spacing U between adjacent first heavily doped areas 141; a length B of a dopant source sub-layer in the second direction Y is equal to a length O of a first heavily doped area, and a spacing between adjacent dopant source sub-layers in the second direction is equal to the spacing P between adjacent first heavily doped areas 141. In some other embodiments, the arrangement of the dopant source sub-layers can form the sets of heavily doped areas as shown in FIG. 4, and at least two columns of the dopant source sub-layers are arranged to be misaligned in the first direction X.

In some embodiments, the material of the dopant source sub-layers 106 may include, but is not limited to, phosphosilicate glass or borophosphosilicate glass.

Figure 19:
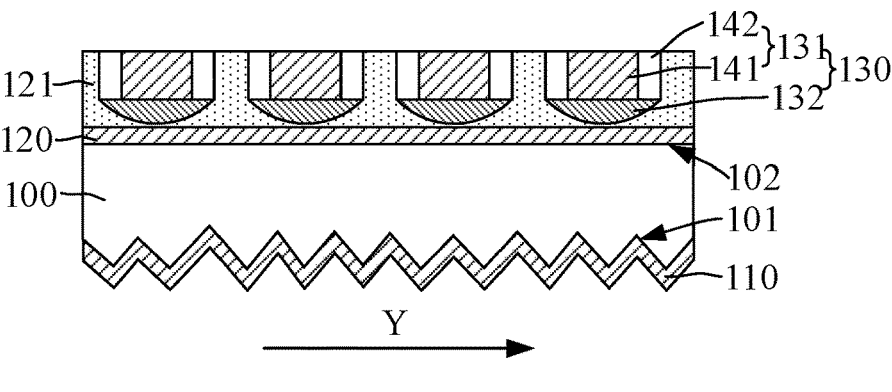

Referring to FIG. 19, a diffusion treatment is performed to diffuse the doping element in the dopant source sub-layers 106 (referring to FIG. 17) into the doped conductive film 103 to form the sets 130 of heavily doped areas. Then the dopant source sub-layers 106 are removed.

The solar cell as shown in FIG. 16 and FIG. 19 can be formed by using a nanosecond laser with a laser wavelength of 532 nm or other lasers that can realize doping. The process parameters of the laser include: the laser frequency is 220 kHz to 380 kHz; the laser energy density is 0.1 J/cm² to 0.2 J/cm²; the laser line scan speed is 20 m/s to 35 m/s. In some embodiments, the process parameters of the diffusion treatment used for forming the solar cells as shown in FIGS. 16 and 19 may be different. As an example, the process parameters for forming the solar cell as shown in FIG. 16 include: the laser frequency is 220 kHz to 350 kHz, the laser energy density is 0.15 J/cm² to 0.2 J/cm², the laser line scan speed is 26 m/s to 35 m/s, and the width of the laser light spot is 80 μm to 110 μm. The process parameters for forming the solar cell as shown in FIG. 19 include: the laser frequency is 280 kHz to 380 kHz, the laser energy density is 0.1 J/cm² to 0.15 J/cm², the laser line scan speed is 20 m/s to 28 m/s, and the width of the laser light spot is 20 μm to 60 μm.

Figure 20:
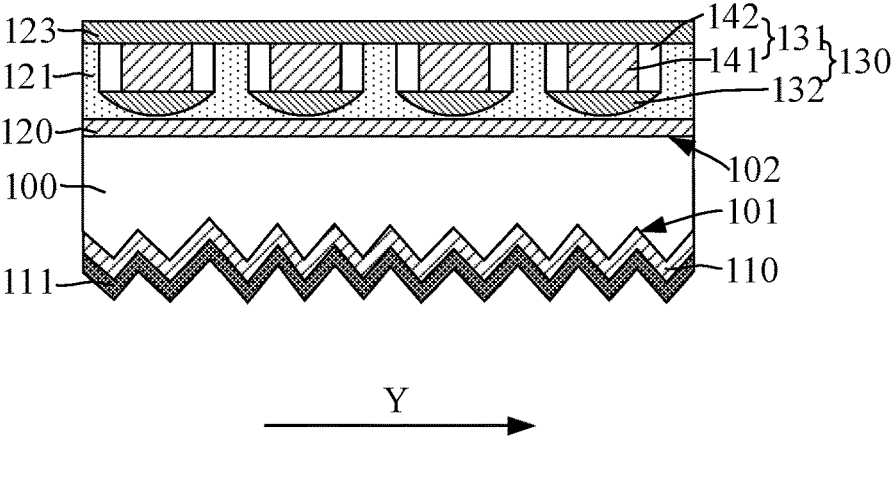

Referring to FIG. 20, a passivation layer 123 and a first passivation layer 111 are formed, the passivation layer 123 is located on the surface of the doped conductive layer 121 away from the substrate 100, and the first passivation layer 111 is located on the surface of the emitter 110. The passivation layer 123 is regarded as a rear passivation layer, and the first passivation layer 111 is regarded as a front passivation layer. For those skilled in the art, the passivation layer 123 and the first passivation layer 111 also function as anti-reflection layers to increase light utilization.

Figure 21:
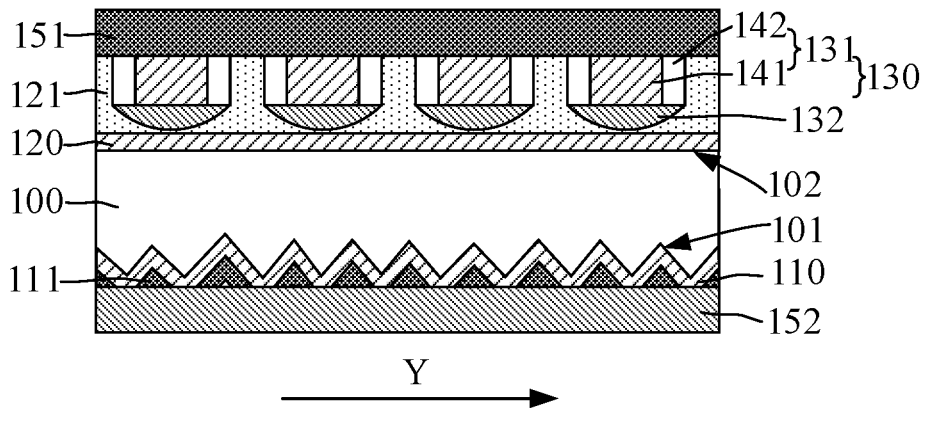

Referring to FIG. 21, a plurality of electrodes 151 arranged at intervals in the first direction X are formed, each of the plurality of electrodes 151 extends in the second direction Y, corresponds to the plurality of sets 130 of heavily doped areas and is in contact with at least part of the surface structures of each set 130 of heavily doped areas of the doped conductive layer 121. The plurality of electrodes 151 are regarded as lower electrodes or back electrodes.

Referring to FIG. 21, a plurality of first electrodes 152 arranged at intervals in the first direction X are formed, each of the plurality of first electrodes 152 extends in the second direction Y, penetrates the first passivation layer 111 and is in contact with the emitter 110. The plurality of first electrodes 152 are regarded as upper electrodes or front electrodes.

In some other embodiments, the production method for a solar cell can be used to form the solar cell as shown in FIG. 5, the method includes: providing the substrate 200 including a first surface 201 and a second surface 202 opposite to the first surface; forming, in sequence, the tunnel dielectric layer 220, the doped conductive layer 221, the passivation layer 222 and the plurality of electrodes 251 arranged at intervals in the first direction X, where the tunnel dielectric layer 220, the doped conductive layer 221, the passivation layer 222 and the plurality of electrodes 251 are stacked and located on a side on which the first surface 201 is located, and each of the plurality of electrodes 251 penetrates the passivation layer 222 and is in contact with the doped conductive layer 221; and forming, in sequence, the second passivation layer and the electrodes 252 located on a side on which the second surface 202 is located, the electrodes 252 penetrates the second passivation layer and is in contact with the substrate 200.

It should be understood that the process steps for forming the second passivation layer are the same as or similar to the process steps for forming the first passivation layer 111 (referring to FIG. 20) in the above-mentioned embodiments, and will not be repeated here. Similarly, the process steps for forming the electrode 252 are the same as or similar to the process steps for forming the electrode 151 (referring to FIG. 21) in the above-mentioned embodiments.

In some other embodiments, the production method for a solar cell can be used to form the solar cell as shown in FIG. 6, the method includes: providing the substrate 300 including a first surface 301 and a second surface 302 opposite to the first surface; forming, in sequence, the first tunnel dielectric layer 323, the first doped conductive layer 324, the third passivation layer 325 and the electrode 352 that are stacked and located on a side on which the first surface 301 is located, where the electrode 352 penetrates the third passivation layer 325 and is in contact with the first doped conductive layer 324; and forming, in sequence, the tunnel dielectric layer 320, the doped conductive layer 321, the passivation layer and the plurality of electrodes 351 arranged at intervals in the first direction X, where the tunnel dielectric layer 320, the doped conductive layer 321, the passivation layer and the plurality of electrodes 351 are stacked and located on a side on which the second surface 302 is located, and each of the plurality of electrodes 351 penetrates the passivation layer and is in contact with the doped conductive layer 321.

It should be understood that the process steps for forming the first tunnel dielectric layer 323 are the same as or similar to the process steps for forming the tunnel dielectric layer 120 (referring to FIG. 11) in the above-mentioned embodiments, and will not be repeated here. Similarly, the process steps for forming the first doped conductive layer 324 are the same as or similar to the process steps for forming the doped conductive film 103 (referring to FIG. 11) in the above-mentioned embodiments. The process steps for forming the third passivation layer 325 are the same as or similar to the process steps for forming the passivation layer (referring to FIG. 20) in the above-mentioned embodiments. The process steps for forming the electrode 352 are the same as or similar to the process steps for forming the electrode 151 (referring to FIG. 21) in the above-mentioned embodiments.

In some other embodiments, the production method for a solar cell can be used to form the solar cell as shown in FIG. 7, the method includes: providing the substrate 400 including the first surface 401 and the second surface 402 opposite to the first surface; forming, in sequence, the tunnel dielectric layer 420, the doped conductive layer 421, the passivation layer 422 and the plurality of electrodes 451 arranged at intervals in the first direction X, where the tunnel dielectric layer 420, the doped conductive layer 421, the passivation layer 422 and the plurality of electrodes 451 are stacked and located on a side on which the first surface 401 is located, and each of the plurality of electrodes 451 penetrates the passivation layer 422 and is in contact with the doped conductive layer 421; and forming, in sequence, the first tunnel dielectric layer 423, the first doped conductive layer 424, the third passivation layer and the electrode 452 that are stacked and located on a side on which the second surface 402 is located, the electrode 452 penetrates the third passivation layer and is in contact with the first doped conductive layer 424.

Those having ordinary skill in the art shall understand that the above embodiments are exemplary implementations for realizing the present disclosure. In practice, any person skilled in the art to which the embodiments of the present disclosure belong may make any modifications and changes in forms and details without departing from the scope disclosed in the embodiments of the present disclosure. Therefore, the patent protection scope of the present disclosure shall still be subject to the scope limited by the appended claims.

What is claimed is:

1. A solar cell, comprising:

a substrate, including a N type or P type doping element;

a tunnel dielectric layer, located on a surface of the substrate;

a doped conductive layer, located on a surface of the tunnel dielectric layer away from the substrate, wherein the doped conductive layer includes a doping element of a same type as that of the doping element in the substrate, the doped conductive layer further includes a plurality of sets of heavily doped areas, wherein each respective set of heavily doped areas of the plurality of sets of heavily doped areas occupies an area having a length along a first direction and a width along a second direction, the length being greater than the width, and wherein the each respective set of heavily doped areas includes at least one first heavily doped area extending in the first direction and at least one second heavily doped area extending in the first direction, doping concentration of the at least one first heavily doped area is greater than doping concentration of the at least one second heavily doped area, and wherein the plurality of sets of heavily doped areas are arranged at intervals in the second direction; and a plurality of electrodes arranged at intervals in the first direction, wherein each of the plurality of electrodes extends in the second direction and corresponds to the plurality of sets of heavily doped areas, and wherein each of the plurality of electrodes contacts with at least part of each set of heavily doped areas of the doped conductive layer;

wherein a space between any two adjacent first heavily doped areas among the plurality of sets of heavily doped areas is occupied by portions of two adjacent second heavily doped areas and by a portion of the substrate between the portions of two adjacent second heavily doped areas, and the space has a dimension P in the second direction and $0.2O \geq P \geq 0.05O$, and wherein O represents a dimension of a first heavily doped area along the second direction; and wherein $0.00006L \geq P \geq 0.00001L$, L represents a dimension of an electrode along the second direction.

2. The solar cell according to claim 1, wherein a width of a set of heavily doped areas in the first direction is M and $N \leq M \leq 2N$, wherein N represents a width of an electrode.

3. The solar cell according to claim 2, wherein each respective set of the plurality of sets of heavily doped areas comprises a plurality of subsets of doped areas, and each respective subset of the plurality of subsets of doped areas comprises a first heavily doped area and a second heavily doped area, wherein the plurality of subsets of doped areas are arranged in the first direction, and wherein a width of a subset of doped areas is W and $0.1N \leq W \leq 1.2N$.

4. The solar cell according to claim 3, wherein a spacing between adjacent subsets of doped areas in the first direction is U and $2\mu m \leq U \leq 10\mu m$.

5. The solar cell according to claim 3, wherein at least two subsets of doped areas are arranged to be misaligned in the first direction.

6. The solar cell according to claim 1, wherein in a direction perpendicular to the surface of the substrate, a doping depth of the plurality of sets of heavily doped areas is less than or equal to a thickness of the doped conductive layer.

7. The solar cell according to claim 1, wherein each respective set of the plurality of sets of heavily doped areas includes a first region and a second region arranged in a direction perpendicular to the substrate, wherein a doping concentration of the second region is smaller than a doping concentration of the first region, and each of the plurality of electrodes is in contact with the first region of each set of heavily doped areas of the doped conductive layer.

8. The solar cell according to claim 7, wherein a shape of a cross-section of the second region in the first direction is an arc shape or a semicircle shape.

9. The solar cell according to claim 7, wherein the doping concentration of the second region is greater than or equal to a doping concentration of the doped conductive layer, and the doping concentration of the second region decreases in a gradient in a direction from the first region to the second region.

10. The solar cell according to claim 6, wherein each respective set of the plurality of sets of heavily doped areas comprises a first region and a second region arranged in the direction perpendicular to the substrate, wherein a doping concentration of the second region is smaller than a doping concentration of the first region, and each of the plurality of electrodes is in contact with the first region of each set of heavily doped areas of the doped conductive layer.

11. A photovoltaic module, comprising:

at least one cell string formed by a plurality of solar cells;

an encapsulation adhesive film used for covering a surface of the at least one cell string; and a cover plate used for covering a surface of the encapsulation adhesive film facing away from the at least one cell string;

wherein each of the plurality of solar cells includes:

a substrate, including a N type or P type doping element;

a tunnel dielectric layer, located on a surface of the substrate;

a doped conductive layer, located on a surface of the tunnel dielectric layer away from the substrate, wherein the doped conductive layer includes a doping element of a same type as that of the doping element in the substrate, the doped conductive layer further includes a plurality of sets of heavily doped areas, wherein each respective set of heavily doped areas of the plurality of sets of heavily doped areas occupies an area having a length along a first direction and a width along a second direction, the length being greater than the width, and wherein the each respective set of heavily doped areas includes at least one first heavily doped area extending in the first direction and at least one second heavily doped area extending in the first direction, doping concentration of the at least one first heavily doped area is greater than doping concentration of the at least one second heavily doped area, and wherein the plurality of sets of heavily doped areas are arranged at intervals in the second direction; and a plurality of electrodes arranged at intervals in the first direction, wherein each of the plurality of electrodes extends in the second direction and corresponds to the plurality of sets of heavily doped areas, and wherein each of the plurality of electrodes contacts with at least part of each set of heavily doped areas of the doped conductive layer;

wherein a space between any two adjacent first heavily doped areas among the plurality of sets of heavily doped areas is occupied by portions of two adjacent second heavily doped areas and by a portion of the substrate between the portions of two adjacent second heavily doped areas, and the space has a dimension P in the second direction and $0.2O \geq P \geq 0.05O$, and wherein O represents a dimension of a first heavily doped area along the second direction; and wherein $0.00006L \geq P \geq 0.00001L$, L represents a dimension of an electrode along the second direction.

12. The photovoltaic module according to claim 11, wherein a width of a set of heavily doped areas in the first direction is M and $N \leq M \leq 2N$, wherein N represents a width of an electrode.

13. The photovoltaic module according to claim 12, wherein each respective set of the plurality of sets of heavily doped areas comprises a plurality of subsets of doped areas, and each respective subset of the plurality of subsets of doped areas comprises a first heavily doped area and a second heavily doped area, wherein the plurality of subsets of doped areas are arranged in the first direction, and wherein a width of a subset of doped areas is W and $0.1N \leq W \leq 1.2N$.

14. The photovoltaic module according to claim 13, wherein at least two subsets of doped areas are arranged to be misaligned in the first direction.

15. The photovoltaic module according to claim 11, wherein in a direction perpendicular to the surface of the substrate, a doping depth of the plurality of sets of heavily doped areas is less than or equal to a thickness of the doped conductive layer.

16. The photovoltaic module according to claim 11, wherein each respective set of the plurality of sets of heavily doped areas includes a first region and a second region arranged in a direction perpendicular to the substrate, wherein a doping concentration of the second region is smaller than a doping concentration of the first region, and each of the plurality of electrodes is in contact with the first region of each set of heavily doped areas of the doped conductive layer.

17. The photovoltaic module according to claim 16, wherein the doping concentration of the second region is greater than or equal to a doping concentration of the doped conductive layer, and the doping concentration of the second region decreases in a gradient in a direction from the first region to the second region.

* * * * *